United States Patent
Giewont et al.

(10) Patent No.: US 6,475,893 B2
(45) Date of Patent: Nov. 5, 2002

(54) METHOD FOR IMPROVED FABRICATION OF SALICIDE STRUCTURES

(75) Inventors: Kenneth J. Giewont, Hopewell Junction, NY (US); Yun Yu Wang, Poughquag, NY (US); Russell Arndt, Wappingers Falls, NY (US); Craig Ransom, Hopewell Junction, NY (US); Judith Coffin, Pleasant Valley, NY (US); Anthony Domenicucci, New Paltz, NY (US); Michael MacDonald, Yorktown Height, NY (US); Brian E. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/822,588

(22) Filed: Mar. 30, 2001

(65) Prior Publication Data

US 2002/0142616 A1 Oct. 3, 2002

(51) Int. Cl.[7] .................. H01L 21/3205; H01L 21/4763
(52) U.S. Cl. ....................................... 438/586; 438/689
(58) Field of Search ................................ 438/689, 586

(56) References Cited

U.S. PATENT DOCUMENTS

| | | | |
|---|---|---|---|
| 4,230,523 A | * | 10/1980 | Gajda ......................... 156/657 |
| 4,269,654 A | | 5/1981 | Deckert et al. |
| 4,378,628 A | | 4/1983 | Levinstein et al. |
| 4,912,061 A | | 3/1990 | Nasr |
| 5,047,367 A | | 9/1991 | Wei et al. |
| 5,780,929 A | * | 7/1998 | Zeininger et al. ........... 257/751 |
| 5,853,491 A | | 12/1998 | Schulz |
| 5,893,751 A | | 4/1999 | Jenq et al. |
| 5,904,560 A | * | 5/1999 | Brumley ..................... 438/639 |
| 5,970,370 A | * | 10/1999 | Besser et al. ................ 438/586 |
| 6,066,267 A | | 5/2000 | Rath et al. |
| 6,107,096 A | | 8/2000 | Mikagi |
| 6,165,279 A | | 12/2000 | Tsao et al. |
| 6,167,891 B1 | | 1/2001 | Kudelka et al. |
| 6,184,132 B1 | | 2/2001 | Cantell et al. |
| 6,255,179 B1 | | 7/2001 | Cantell et al. |
| 6,277,749 B1 | * | 8/2001 | Funabashi ................... 438/689 |
| 6,335,294 B1 | | 1/2002 | Agnello et al. |

* cited by examiner

Primary Examiner—Richard Elms
Assistant Examiner—Michael K. Luhrs
(74) Attorney, Agent, or Firm—Canton Colburn LLP; Margaret Pepper

(57) ABSTRACT

A method for preparing a semiconductor material for formation of a silicide layer on selected areas thereupon is disclosed. In an exemplary embodiment of the invention, the method includes removing at least one of a nitride and an oxynitride film from the selected areas, removing metallic particles from the selected areas, removing surface particles from the selected areas, removing organics from the selected areas, and removing an oxide layer from the selected areas.

26 Claims, 6 Drawing Sheets

METHOD FOR IMPROVED FABRICATION OF SALICIDE STRUCTURES

BACKGROUND

The present invention relates generally to semiconductor processing and, more particularly, to improved techniques for fabricating cobalt silicide layers for use in self-aligned (salicide) technology.

In the manufacture of semiconductor devices, salicide (or self-aligned silicide) materials are formed upon gate conductors and diffusion regions to reduce the line resistance of a CMOS device, thereby improving the speed characteristics thereof. In salicide technology, a refractory metal or a near noble metal, such as titanium, is deposited on a silicon substrate. The deposited titanium is then annealed, thereby forming a silicide layer only on the exposed areas of the substrate. The areas of unreacted titanium left on the dielectric may then be selectively etched away without a masking step. Thus, the process is "self-aligning".

As circuit devices have continued to shrink in size, however, it has been found that titanium silicide ($TiSi_2$) becomes an unsatisfactory silicide material since the sheet resistance thereof begins to sharply increase when the linewidth of the device decreases below 0.20 $\mu$m. More recently, cobalt disilicide ($CoSi_2$) has been used as a replacement for titanium in salicide structures since it does not suffer from a linewidth dependent sheet resistance problem. On the other hand, the use of cobalt silicide structures is not without its own drawbacks. For example, unlike titanium, a cobalt layer requires a cap layer such as titanium nitride (TiN) due to the sensitivity of cobalt to contaminants during the annealing process. In addition, it has also been found that a silicon substrate must be stripped of any native oxide layer thereupon before cobalt is deposited. Otherwise, the diffusion of silicon and cobalt is impaired, leading to incomplete formation of CoSi and resulting in poor salicide formation. Accordingly, a formative process is now needed to minimize and/or eliminate the aforementioned drawbacks to produce an effective $CoSi_2$ layer.

BRIEF SUMMARY

The above discussed and other drawbacks and deficiencies of the prior art are overcome or alleviated by a method for preparing a semiconductor material for the formation of a silicide layer on selected areas thereupon. In an exemplary embodiment of the invention, the method includes removing at least one of a nitride and an oxynitride film from the selected areas, removing metallic particles from the selected areas, removing surface particles from the selected areas, removing organics from the selected areas, and removing an oxide layer from the selected areas.

In a preferred embodiment, removing at least one of a nitride and an oxynitride film from the selected areas further comprises treating the selected areas with a hydrogen fluoride (HF)/ ethylene glycol (EG) etch solution. The concentration of the hydrogen fluoride (HF)/ ethylene glycol (EG) etch solution is about 96% ethylene glycol : 4% (49% by volume) HF. In addition, removing metallic particles, surface particles and organics from the selected areas further comprises a S/P HuangAB clean, which includes: treating the selected area with a sulfuric acid ($H_2SO_4$) and hydrogen peroxide ($H_2O_2$) solution, treating the selected area with a hydrogen peroxide ($H_2O_2$) and ammonium hydroxide ($NH_4OH$) solution, and treating the selected area with a hydrogen peroxide ($H_2O_2$) and hydrochloric acid (HCl) solution. Removing organics from the selected areas also comprises an ozone plasma clean, which produces an oxide layer of about 5–60 angstroms on the selected areas. Finally, removing the oxide layer from the selected areas comprises treating the selected areas with a dilute hydrofluoric acid (DHF) etch solution.

BRIEF DESCRIPTION OF THE DRAWINGS

Referring to the exemplary drawings wherein like elements are numbered alike in the several Figures.

DETAILED DESCRIPTION

Figure 1:
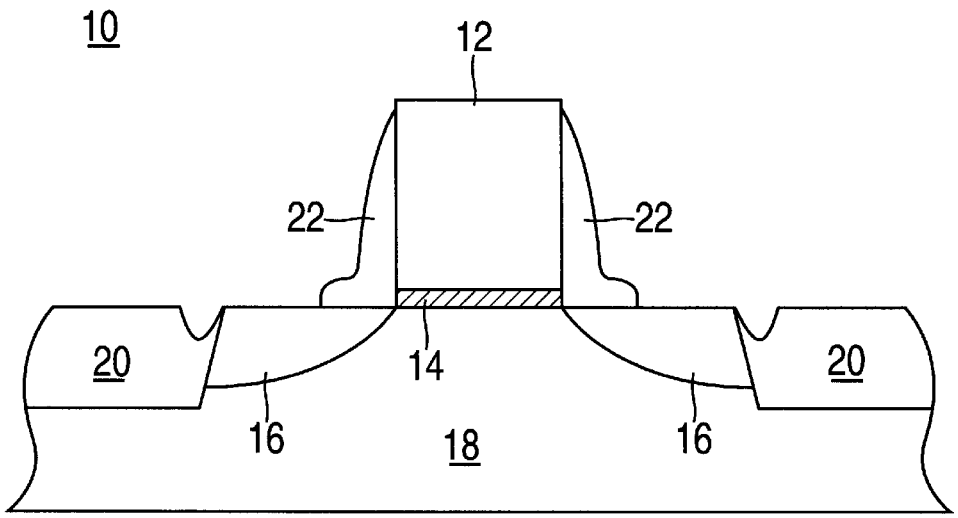
FIG. 1 is a cross sectional view of a MOS transistor having a doped polysilicon gate structure formed between doped silicon diffusion areas, prior to the pre-cleaning thereof.

Referring initially to FIGS. 1 through 4, the formation of a metal salicide on a narrow gate conductor (and the source/drain regions of a MOS transistor) using an existing pre-cleaning process is illustrated. In particular, FIG. 1 shows a MOS transistor 10 having a doped polysilicon gate structure 12 formed atop gate oxide 14 and between doped silicon diffusion regions 16. Doped silicon diffusion regions 16 within substrate 18 are transistor source and drain regions, and are each separated from a neighboring silicon diffusion region (not shown) by a shallow trench oxide (STI) 20. Nitride spacers 22 isolate the polysilicon gate structure 12 from the doped silicon diffusion areas 16.

Prior to the formation of the CoSi layer on the polysilicon gate structure and the silicon diffusion areas, the wafer surfaces are first pre-cleaned of prior process residue, including any native oxide layers present thereupon, in order to produce a uniform salicide structure. An existing pre-cleaning sequence, as described below, employs the following cleaning steps:

(1) a S/P HuangAB clean;

(2) an ozone plasma clean; and (3) a dilute hydrofluoric acid (DHF) etch.

(1) First, a "S/P HuangAB" clean is used to remove any light organics, metallics or other surface particles which might interfere with the CoSi formation process. The S/P HuangAB clean is a three-step, wet chemical process starting with a sulfuric acid/hydrogen peroxide cleaning cycle, then followed by the "RCA-clean" process, which is well known in the art.

Using a wet cleaning spray tool, such as the FSI spray processor, Mercury MP mode, the wafer surfaces are washed in a mixture of sulfuric acid ($H_2SO_4$) and hydrogen peroxide ($H_2O_2$) solution, at a flow rate ratio of about 800 cc/min ($H_2SO_4$):200 cc/min ($H_2O_2$), and at a temperature of about 90° C. for a duration of about 90 seconds. The wafer is then rinsed with deionized water at ambient temperature for about 335 seconds before the RCA clean. The RCA clean involves two additional steps, commonly referred to as standard clean 1 (SC1) and standard clean 2 (SC2). In this case, the SC1 applies a cleaning agent solution of hydrogen peroxide ($H_2O_2$) and ammonium hydroxide ($NH_4OH$) in deionized water at a volume ratio of about 12:2:1. The SC1 is effected for about 180 seconds at a temperature of about 60° C., after which the SC1 solution is rinsed with deionized water for about 300 seconds at ambient temperature. Then, the SC2 applies another solution of hydrogen peroxide ($H_2O_2$) and hydrochloric acid (HCl) in deionized water at a volume ratio of about 12:2:1. The SC2 is effected for about 180 seconds at a temperature of about 60° C., after which the SC2 solution is rinsed with deionized water for about 600 seconds at ambient temperature. The S/P HuangAB process is completed after the wafer is then spun dry.

(2) Next, an ozone plasma clean is then used to remove any organics from the wafer surface which might inhibit the effectiveness of any subsequent wet cleaning steps. Furthermore, the ozone plasma clean will oxidize a silicon surface which, in effect, may act as an aggressive clean for any contaminants on or in the silicon surface. This process results in oxidation of a small amount of silicon, which oxidation is thereafter removed with the DHF etch. The ozone plasma clean may be implemented with an oxide deposition tool, such as the AME 5000 from Applied Materials, Inc. The ozone flow rate is effected at about 3900 standard cubic centimeters per minute, at an atmospheric pressure of about 8.5 Torr, and for a duration of about 60 seconds.

It should be noted that other $O_2$ plasma processes may be substituted for this step, so long as the process effectively cleans organic residue and grows a small amount of $SiO_2$ (about 5–60 angstroms) on the bare silicon surface.

(3) The existing pre-cleaning process is thereafter completed with a DHF etch. The DHF etch is used to remove the native oxide layer on the polysilicon gate and the silicon diffusion regions so that the deposited cobalt can fully react with the underlying silicon. During the drying process thereof, care is taken so that any silicate or other residue formed earlier is not left on the wafer. The DHF etch solution may have a concentration of about 200:1 deionized water: (49% by weight) HF. The etching is carried out at about 22° C. until about a 150 angstrom equivalent thermal oxide has been removed. The wafer is then rinsed in deionized water for about 600 seconds and dried by surface tension gradient drying, such as in a Marangoni dryer.

It should be noted that other HF solutions may be substituted for the above, such as a buffered hydrogen fluoride (BHF) or other DHF concentrations, so long as the targeted removal of about 30–200 angstroms of the thermal oxide is controlled and high-quality drying processes are used.

Figure 2:
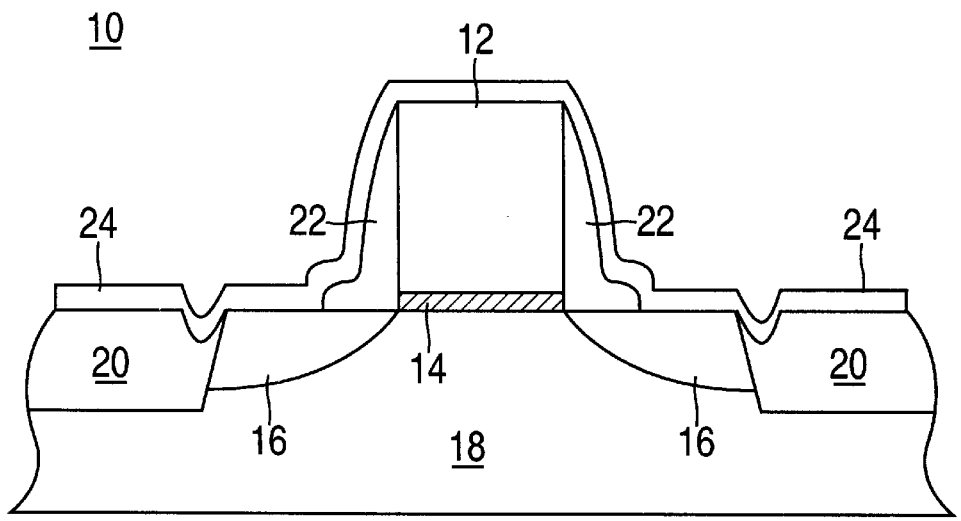
FIG. 2 is a cross section view of the MOS transistor of FIG. 1, illustrating the doped polysilicon gate structure and doped silicon diffusion areas, subsequent to an existing pre-cleaning process and the deposition of a cobalt layer thereupon.
Figure 3:
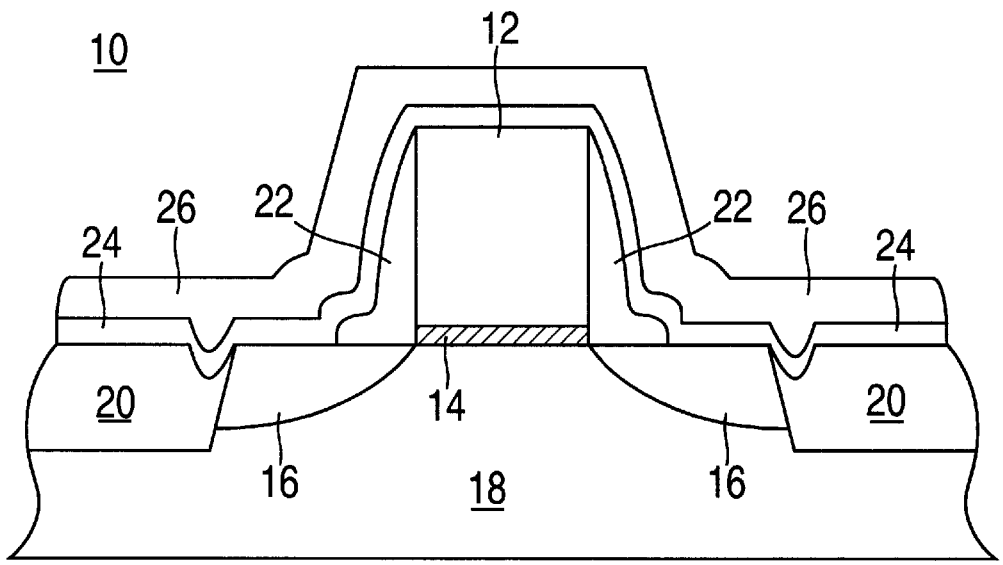
FIG. 3 is a cross sectional view of the MOS transistor of FIGS. 1 and 2, illustrating the doped polysilicon gate structure and doped silicon diffusion regions, subsequent to the deposition of a titanium nitride capping layer thereupon.

Referring now to FIG. 2, following the pre-cleaning sequence described above, a material comprising a cobalt layer 24 of about 60–100 angstroms (preferably 80 angstroms) in thickness is deposited upon transistor 10, including the polysilicon gate structure 12 and the silicon diffusion regions 16. The cobalt layer 24 is then followed by a TiN capping layer 26 deposited thereupon, as illustrated in FIG. 3. The TiN capping layer 26 is about 50–400 angstroms (preferably about 200 angstroms) in thickness. Again, capping layer 26 is used to protect the cobalt layer 24, due to its sensitivity to contamination during an annealing process.

Figure 4:
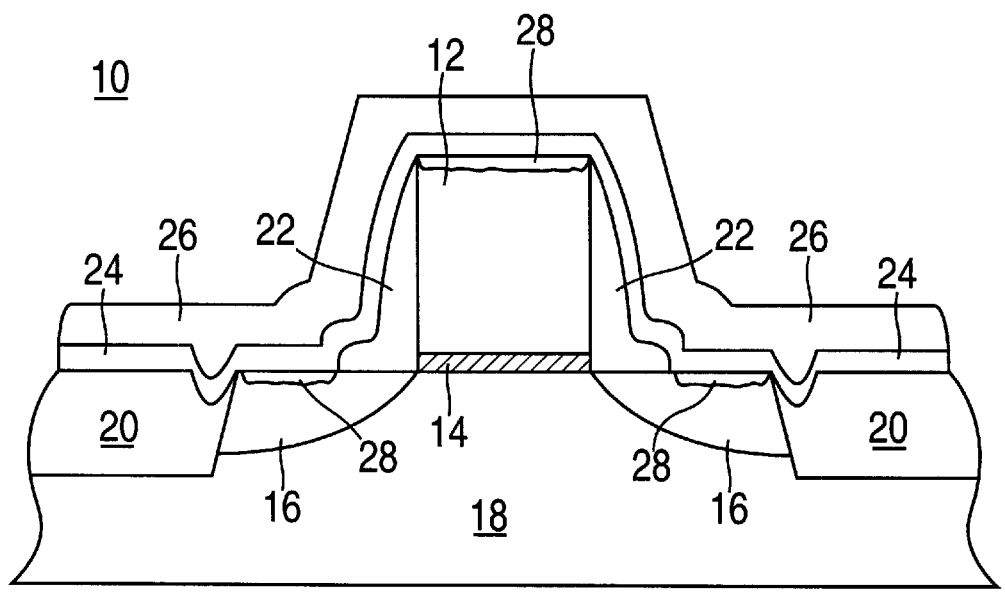
FIG. 4 is a cross sectional view of the MOS transistor of FIGS. 1–3, illustrating the formation of an initial CoSi layer.
Figure 5:
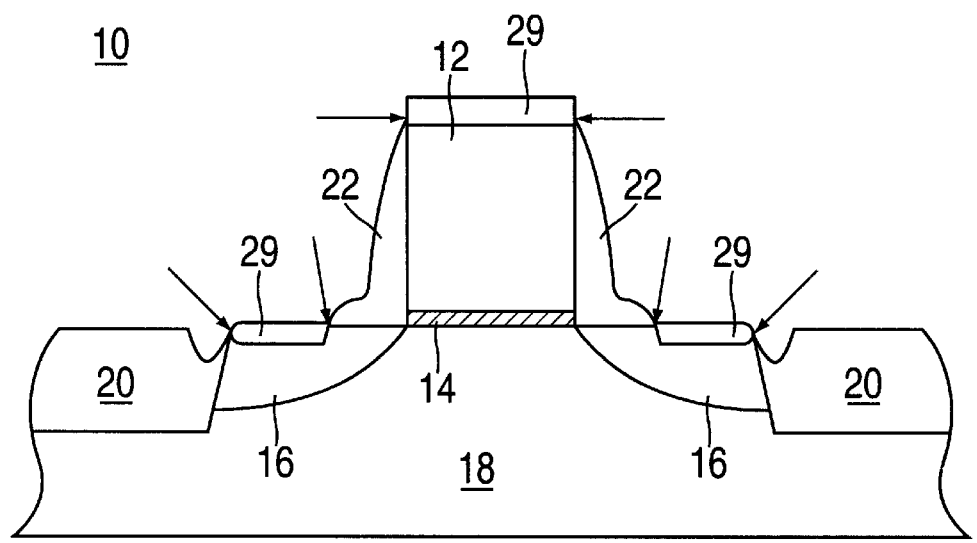
FIG. 5 is a cross sectional view of the MOS transistor of FIGS. 1–4, illustrating the final formation of a $CoSi_2$ salicide structure.

The next step in the salicide formation process is a first rapid thermal anneal (RTA) to produce an initial cobalt monosilicide (CoSi) layer 28, as illustrated in FIG. 4. The first RTA is carried out in the presence of nitrogen or argon at a temperature range of about 480 to 575° C. for a time duration of about 30 seconds to 2 minutes. During the first RTA, the upward diffusion of silicon (from gate structure 12 and regions 16) and the downward diffusion of cobalt atoms (from layer 24) form the initial CoSi layer 28. Following the first RTA, the TiN capping layer 26 (along with any unreacted cobalt from layer 24) is removed with a standard S/P HuangAB clean. As a result, the initial CoSi layer 28 remains upon the polysilicon gate structure 12 and the doped silicon diffusion regions 16. Finally, the salicide structure is completed following a second RTA. The second RTA is carried out at about 700–800° C. for a duration of about 30 seconds to 2 minutes, thereby resulting in the formation of final cobalt disilicide ($CoSi_2$) layers 29 atop the polysilicon gate structure 12 and the silicon diffusion regions 16, as seen in FIG. 5.

However, it has recently been discovered that the presence of a nitride or oxynitride film upon the doped silicon, even after the pre-cleaning process described above, may cause incomplete formation of CoSi following the first RTA. More specifically, the presence of a nitride or oxynitride layer slows down (or possibly totally blocks) the diffusion process of the Co and Si atoms. Furthermore, the slow diffusion process allows nitrogen atoms from the TiN capping layer to travel downward and further inhibit a complete reaction. Because silicon oxynitride blocks the upward diffusion of silicon, a metallic rich layer of cobalt remains. In some cases, too much downward diffusion of nitrogen results in a pure metal layer, even after the first RTA. Thus, when the TiN capping layer is stripped, so is any unreacted cobalt. Ultimately, any CoSi remaining is too thin to form an effective $CoSi_2$ layer following the second RTA, as a thin $CoSi_2$ layer causes an increase in the polyline or diffusion resistance. In particular, the corner regions of the doped silicon and polysilicon areas (indicated with arrows in FIG. 5) are susceptible to poor CoSi formation.

Therefore, in accordance with an embodiment of the invention, an improved method for preparing a substrate material for the formation of a silicide layer thereupon is disclosed. More specifically, an improved pre-cleaning process targeted toward removing any thin nitride or oxynitride films prior to a first RTA is disclosed.

Figure 6:
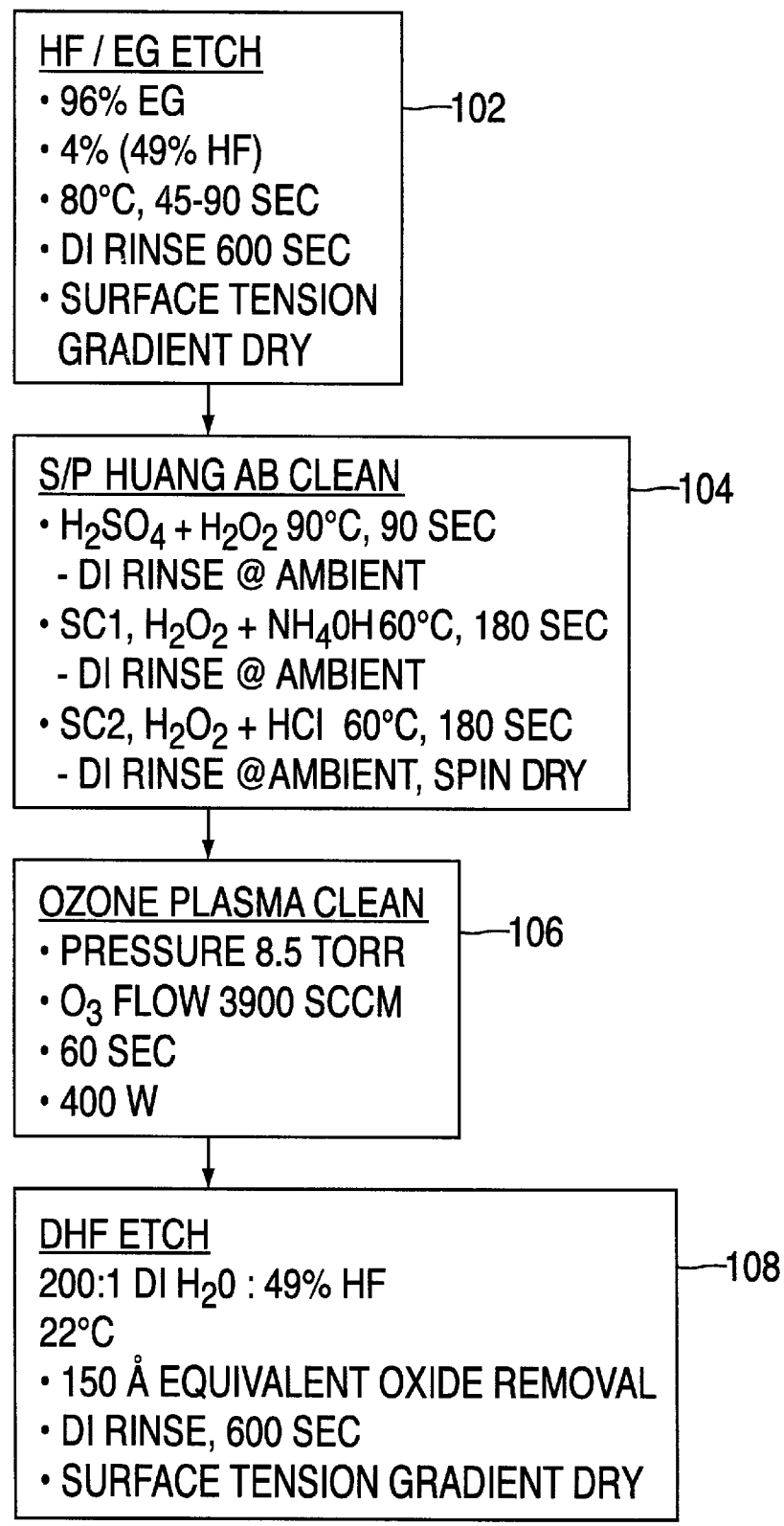
FIG. 6 is a block diagram illustrating a sequence of pre-cleaning steps in accordance with an embodiment of the invention.

Referring now to FIG. 6, there is shown a block diagram which illustrates a pre-cleaning sequence in accordance with an embodiment of method 100. Method 100 begins at block 102 where the wafer surface (as illustrated in FIG. 1) is first treated with a hydrogen fluoride (HF)/ethylene glycol (EG) etch. The HF/EG etch, being a high-boiling organic solvent, is particularly suitable for removing a nitride or oxynitride layer since the presence of the organic solvent decreases the etch rate of silicon dioxide substantially in comparison to the etch rate of silicon nitride. In a preferred embodiment, the concentration of the HF/EG solution is about 96% ethylene glycol: 4% (49% by volume) HF, at a solution temperature of about 80° C. The desired equivalent LPCVD nitride removal is about 60 angstroms. Thus, for a nitride removal range of about 30–60 angstroms, the etch duration is about 45 to 90 seconds. Following the HF/EG etch, the wafer is then dried by surface tension gradient drying.

An HF/glycerin solution may be substituted for the HF/EG solution at block 102. In addition, process times, temperature and solution concentrations may be varied so long as a targeted silicon nitride/silicon oxide etch of about 10–100 angstroms (preferably about 30–60 angstroms) is maintained.

The pre-cleaning sequence is then finished at blocks 104, 106 and 108, where the S/P HuangAB clean, the ozone plasma clean, and the dilute hydrofluoric acid (DHF) etch steps are carried out as explained earlier. This time, however, an improved formation of silicide structures results, in part due to the removal of the nitride and oxynitride layers which might otherwise inhibit the DHF etch from cleaning the wafer surface as designed.

Figure 7:
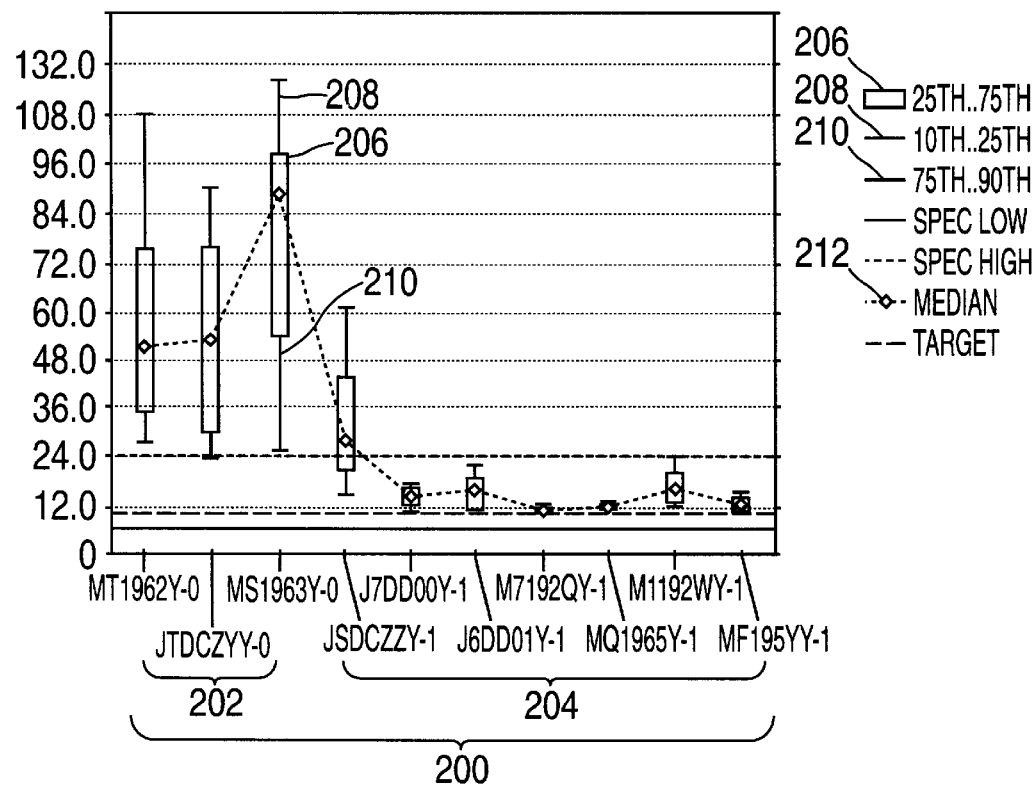
FIGS. 7 and 8 are graphs which illustrate a comparison between the sheet resistance of salicide structures formed with and without all of the pre-cleaning steps shown in FIG. 6.
Figure 8:
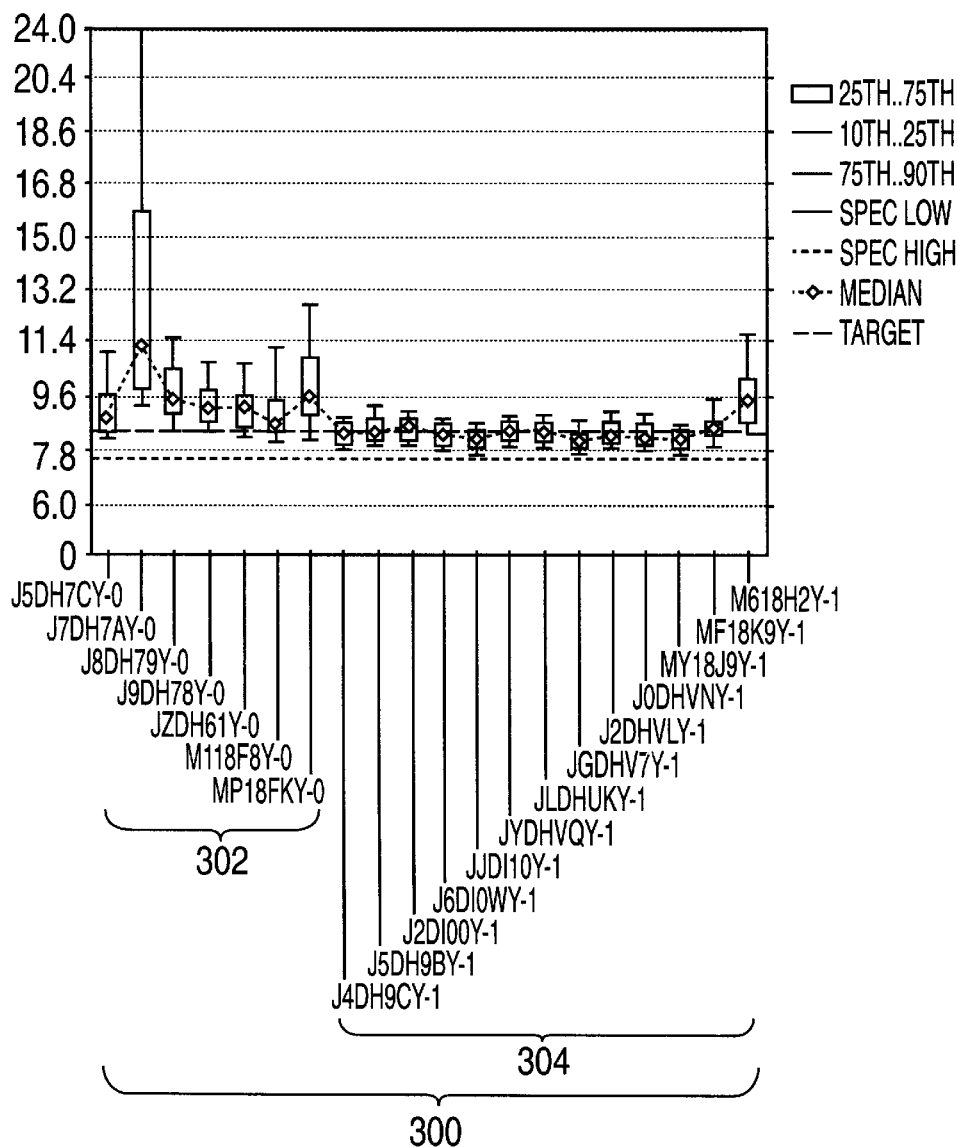

FIGS. 7 and 8 are graphs which illustrate a comparison between the sheet resistance of salicide structures formed with and without all of the pre-cleaning steps shown in FIG. 6. In both Figures, a single lot was split between the existing pre-cleaning process and the pre-cleaning method 100. The polyline width was fixed within a given lot and was in the range of about 60–100 nanometers. Referring now to FIG. 7, a first experimental lot 200 of wafers having cobalt silicide structures was created using the earlier described conventional pre-cleaning process and the pre-cleaning method 100 in FIG. 6. Of the ten wafers in first experimental lot 200, one group 202 of three wafers have salicide structures formed using the earlier described conventional pre-cleaning process and are designated with the suffix "0" following the alphanumeric wafer designation. Another group 204 of the other seven wafers were formed in accordance with method 100 and are designated with the suffix "1" following the alphanumeric wafer designation.

The sheet resistance (in ohms per square) of the doped polysilicon gate structures with the $CoSi_2$ interconnect were measured at several random points thereupon. Lower resistance values indicate a more uniform formation of CoSi and $CoSi_2$. As can be seen from the graph in FIG. 7, there is a range of resistance values associated with each tested wafer. The resistance ranges are from the $10^{th}$ percentile to the $90^{th}$ percentile for all values measured. A narrower range of resistance values, from the $25^{th}$ percentile to the $75^{th}$ percentile, is indicated by a thick bar 206. A vertical line 208 above the thick bar 206 represents resistance values between the $75^{th}$ percentile and the $90^{th}$ percentile, while vertical line 210 below thick bar 206 represents resistance values between the $10^{th}$ percentile and the $25^{th}$ percentile. A dashed line 212 connects the median values (indicated by diamonds) for each wafer.

It will be seen from FIG. 7 that, in addition to having much greater resistance value ranges, the overall median sheet resistances for the devices formed with a conventional pre-clean sequence are higher than that of those formed in accordance with the pre-clean sequence in method 100. For narrow gate structures having salicide layers, it is desired that the sheet resistance thereof be less than 24 ohms/square. Of those devices shown in FIG. 7, all three wafers in group 202 had median sheet resistances in excess of 48 ohms/square, while only one wafer in group 204 had a median sheet resistance in excess of 24 ohms/square.

Finally, FIG. 8 illustrates the resistance values of a second experimental lot 300 of wafers having cobalt silicide structures created using the earlier described conventional pre-cleaning process and the pre-cleaning method 100 in FIG. 6. Although the overall results for all wafers in second experimental lot 300 is improved from first experimental lot 200, in terms of the sheet resistance, it is still seen that the resistance values for the wafers of group 302 (conventional pre-cleaning) are higher and have a greater range than the wafers of group 304 (pre-cleaning in accordance with method 100).

By adding a pre-cleaning step to eliminate nitride and oxynitride films, it has been demonstrated that the formation of CoSi and $CoSi_2$ following deposition and annealing is more uniform and hence results in lower sheet resistances over the conventional pre-cleaning methods. In addition, although the exemplary embodiments described used cobalt as the near noble metal for the salicide structures, it will be appreciated that method 100 applies to other materials including, but not limited to, titanium (Ti), molybdenum (Mo), nickel (Ni), or any like alloy combination thereof. Furthermore, the sequence of pre-clean steps in method 100 may be changed so long as the DHF etch is performed last. For example, an alternative embodiment of method 100 may comprise the pre-cleaning steps in the following sequence: (1) ozone plasma clean; (2) HF/EG etch; (3) S/P HuangAB clean; and (4) DHF etch.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for preparing a semiconductor material for the formation of a silicide layer on selected areas thereupon, the selected areas including at least one doped gate structure and at least one doped diffusion region, the selected areas further including at least one of a nitride film and an oxynitride film, the method comprising:

removing said at least one of a nitride film and an oxynitride film from the selected areas.

2. The method of claim 1, wherein said removing at least one of a nitride film and an oxynitride film from the selected areas comprises treating the selected areas with an etch solution comprising hydrogen fluoride (HF) and ethylene glycol (EG).

3. The method of claim 2, wherein said hydrogen fluoride (HF)/ethylene glycol (EG) etch solution has a concentration of about 96% ethylene glycol: 4% (49% by volume) HF.

4. The method of claim 1, wherein said removing at least one of a nitride film and an oxynitride film from the selected areas comprises treating the selected areas with an etch solution comprising hydrogen fluoride (HF) and glycerin.

5. The method of claim 1, wherein a removal range of said at least one of a nitride film and an oxynitride film is about 30–60 angstroms.

6. The method of claim 1, further comprising:

removing metallic particles from the selected areas;

removing surface particles from the selected areas;

removing organics from the selected areas; and removing an oxide layer from the selected areas.

7. The method of claim 6, wherein said removing metallic particles, said removing surface particles and said removing organics from the selected areas comprises a S/P HuangAB clean, said S/P HuangAB clean comprising:

treating the selected areas with a solution comprising sulfuric acid ($H_2SO_4$) and hydrogen peroxide ($H_2O_2$)

treating the selected area with a solution comprising hydrogen peroxide ($H_2O_2$) and ammonium hydroxide ($NH_4OH$); and treating the selected area with a solution comprising hydrogen peroxide ($H_2O_2$) and hydrochloric acid (HCl).

8. The method of claim 6, wherein said removing organics from the selected areas comprises an ozone plasma clean.

9. The method of claim 8, wherein said ozone plasma clean produces an oxide layer having a thickness of about 5–60 angstroms on the selected areas.

10. The method of claim 6, wherein said removing an oxide layer from the selected areas comprises treating the selected areas with a dilute hydrofluoric acid (DHF) etch solution.

11. The method of claim 10, wherein:

said dilute hydrofluoric acid (DHF) etch solution has a concentration of about 200:1 deionized water: (49% by weight) HF; and a removal range of said oxide layer is about 150 angstroms.

12. A salicide structure, comprising:

a polysilicon gate structure formed atop a gate oxide;

at least one doped silicon diffusion region formed within a substrate; and a cobalt disilicide ($CoSi_2$) layer formed upon said polysilicon gate structure and said silicon diffusion region, after said polysilicon gate structure and said doped silicon diffusion region have been pre-cleaned by the method of claim 1;

wherein said cobalt disilicide ($CoSi_2$) layer has a contact resistance of less than 15 ohms per square.

13. The salicide structure of claim 12, wherein said cobalt disilicide ($CoSi_2$) layer further comprises:

an initial cobalt monosilicide (CoSi) layer formed by a first rapid thermal anneal of a cobalt layer deposited upon said polysilicon gate structure and said doped silicon diffusion region; and a final cobalt disilicide ($CoSi_2$) layer formed by a second rapid thermal anneal of said initial cobalt monosilicide (CoSi) layer.

14. A method of forming a salicide structure upon selected areas of a semiconductor substrate, the selected areas including at least one doped gate structure and at least one doped diffusion region, the selected areas further including at least one of a nitride film and an oxynitride film, the method comprising:

pre-cleaning the selected areas of the semiconductor substrate by removing said at least one of a nitride film and an oxynitride film from the selected areas;

depositing a refractory or near noble metal upon the substrate, including the selected areas;

annealing said refractory or near noble metal, thereby causing said refractory or near noble metal to react with the selected areas and form a silicide layer; and removing unreacted portions of said refractory or near noble metal from the semiconductor substrate.

15. The method of claim 14, further comprising:

depositing a capping layer upon said refractory or near noble metal;

performing a first rapid thermal anneal on said refractory or near noble metal, thereby causing said refractory or near noble metal to react with the selected areas and form an initial silicide layer;

removing said capping layer;

removing unreacted portions of said refractory or near noble metal from the semiconductor substrate; and performing a second rapid thermal anneal on said initial silicide layer, thereby forming a final silicide layer.

16. The method of claim 15, wherein:

said refractory or near noble metal comprises cobalt;

said initial silicide layer comprises cobalt monosilicide (CoSi); and said final silicide layer comprises cobalt disilicide ($CoSi_2$).

17. The method of claim 14, wherein said removing at least one of a nitride film and an oxynitride film from the selected areas comprises treating the selected areas with an etch solution comprising hydrogen fluoride (HF) and ethylene glycol (EG).

18. The method of claim 17, wherein said hydrogen fluoride (HF)/ethylene glycol (EG) etch solution has a concentration of about 96% ethylene glycol: 4% (49% by volume) HF.

19. The method of claim 14, wherein said removing at least one of a nitride film and an oxynitride film from the selected areas comprises treating the selected areas with an etch solution comprising hydrogen fluoride (HF) and glycerin.

20. The method of claim 14, wherein a removal range of said at least one of a nitride film and an oxynitride film is about 30–60 angstroms.

21. The method of claim 14, wherein said pre-cleaning further comprises:

removing metallic particles from the selected areas, removing surface particles from the selected areas;

removing organics from the selected areas; and removing an oxide layer from the selected areas.

22. The method of claim 21, wherein said removing metallic particles, said removing surface particles and said removing organics from the selected areas comprises a S/P HuangAB clean, said S/P HuangAB clean comprising:

treating the selected area with a solution comprising sulfuric acid ($H_2SO_4$) and hydrogen peroxide ($H_2O_2$);

treating the selected area with a solution comprising hydrogen peroxide ($H_2O_2$) and ammonium hydroxide ($NH_4OH$); and treating the selected area with a solution comprising hydrogen peroxide ($H_2O_2$) and hydrochloric acid (HCl).

23. The method of claim 21, wherein said removing fan oxide layer from the selected areas comprises treating the selected areas with a dilute hydrofluoric acid (DHF) etch solution.

24. The method of claim 21, wherein said removing organics from the selected areas comprises an ozone plasma clean.

25. The method of claim 24, wherein said ozone plasma clean produces an oxide layer having a thickness of about 5–60 angstroms on the selected areas.

26. The method of claim 23, wherein:

said dilute hydrofluoric acid (DHF) etch solution has a concentration of about 200:1 deionized water: (49% by weight) HF; and a removal range of said oxide layer is about 150 angstroms.

* * * * *